United States Patent [19]

Kasami et al.

[11] 3,934,260
[45] Jan. 20, 1976

[54] RED LIGHT-EMITTING GALLIUM PHOSPHIDE DEVICE

[75] Inventors: Akinobu Kasami, Yokohama; Makoto Naito, Kamakura, both of Japan

[73] Assignee: Tokyo Shibaura Electric Company, Ltd., Kawasaki, Japan

[22] Filed: Oct. 10, 1974

[21] Appl. No.: 513,821

[30] Foreign Application Priority Data

Jan. 29, 1974 Japan............................ 49-11411

[52] U.S. Cl. ............... 357/17; 357/63; 357/64
[51] Int. Cl.² ........... H01L 33/00; H01L 29/167; H01L 29/20; H01L 29/227
[58] Field of Search...................... 357/17, 63, 64

[56] References Cited

UNITED STATES PATENTS

| | | | |
|---|---|---|---|
| 3,703,671 | 11/1972 | Saul.................................. | 357/17 |
| 3,748,579 | 7/1973 | Henry et al..................... | 324/158 D |

*Primary Examiner*—Martin H. Edlow
*Assistant Examiner*—Gene M. Munson
*Attorney, Agent, or Firm*—Oblon, Fisher, Spivak, McClelland & Maier

[57] ABSTRACT

A red light-emitting gallium phosphide device provided with a p-n junction contributing to the emission of light, wherein the maximum concentration of an oxygen donor in a depletion layer surrounding the p-n junction ranges from $1 \times 10^{12} cm^{-3}$ to $5 \times 10^{14} cm^{-3}$.

2 Claims, 5 Drawing Figures

RED LIGHT-EMITTING GALLIUM PHOSPHIDE DEVICE

This invention relates to a red light-emitting gallium phosphide device displaying a high light-emitting efficiency.

It has been disclosed that the red light generated by a light-emitting gallium phosphide appears in the p region of the p-n junction and that the luminescent center consists of zinc (Zn)-oxygen (O) pairs. For a higher light-emitting efficiency, therefore, it is necessary to increase the concentration of said zinc (Zn)-oxygen (O) pairs constituting the luminescent center. Since the zinc component of this luminescent center acts as an acceptor having a shallow level, the concentration of said zinc acceptor in a gallium phosphide crystal can be determined, for example, from the Hall effect. On the other hand, the oxygen component of the luminescent center acts as a donor having a deep level. Therefore, it has been difficult to determine the concentration of said oxygen donor. To date, nothing has been known of the oxygen donor concentration in the depletion layer occurring in the p-n junction as well as in the p region adjacent to said p-n junction.

However, the recent photocapacitance method has established the process of quantitatively determining the oxygen donor concentration in the depletion layer of a red light-emitting gallium phosphide device, making it possible to obtain the profile of the oxygen donor concentration in said depletion layer (For the details of the photocapacitance method, see "Physical Review B", Vol. VII, pages 2486 to 2499, 1973.).

Figure 1:
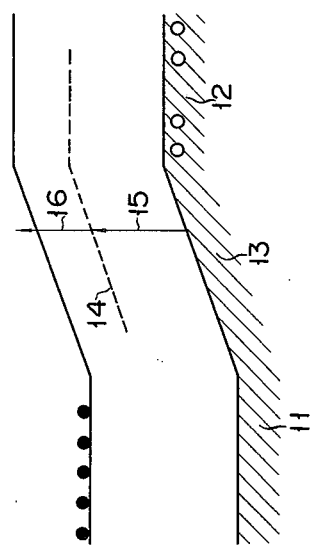

There will now be briefly described the photocapacitance method. The red light-emitting gallium phosphide device includes, as shown in FIG. 1, an n type region 11, p type region 12 and depletion layer 13 surrounding the p-n junctions. Luminescence takes place in the p type region 12. Zn-O pairs constitute a luminescent center. An oxygen donor 14, a component of the luminescent center, is distributed in the depletion layer 13 surrounding the p-n junction and the p region 12. Initially, the oxygen donor 14 is for the greater part positively charged. When, however, the gallium phosphide device is externally irradiated by exciting light 15 of, for example, 1.55 ev, then electrons are transferred from the valence band to the oxygen donor 14 to render it neutral. As the result, the capacitance C of the p-n junction increases and becomes saturated as indicated by the curve 17 of FIG. 2. In this case, the capacitance C alone increases to a normal level $\Delta C$ and remains substantially unchanged even when the exciting light 15 is shut off. When, under this condition, an infrared light of for example, 1.00 ev is projected on the gallium phosphide device, then electrons captured by the oxygen donor 14 are transferred to the conduction band, positively charging the oxygen donor 14 to bring it back to its original state. In consequence the capacitance C also regains its original condition, as shown by the curve 18 of FIG. 2. The above-mentioned increase $\Delta C$ of the capacitance C resulting from the projection of the exciting light 15 may be expressed by the following equation (1-1):

$$\frac{\Delta C}{C} = \int_0^1 dx\, \Delta n(x) \left(\frac{x}{N_A} - \frac{1-x}{N_D}\right) \quad (1\text{-}1)$$

The oxygen donor concentration ($N_0(x)$) in the depletion layer 13 can be determined by the following equation (1-2) derived from the equation (1-1):

$$\Delta n(x) = \gamma N_0(x) \quad (1\text{-}2)$$

Throughout the above equations:
- C: entire capacitance of the p-n junction
- $N_A$: acceptor concentration in the p region 12
- $N_D$: donor concentration in the n region 11
- $\gamma$: proportion of the oxygen donor 14 captured by electrons, which is determined by the energy of the exciting light.

The width of the depletion layer 13 varies with the level of backward voltage externally impressed on the gallium phosphide device, namely, is broadened with increase in said voltage. Therefore, if measurement is made of the increase $\Delta C$ of the capacitance C by raising the level of said backward voltage in small increments, then it is possible to determine the distribution of the oxygen donor 14 in the depletion layer 13 surrounding the p-n junction and the p region 12 thereof. Said measurement should preferably be made at a low temperature such as 170°K little affected by, for example, thermal excitation.

The present inventors measured the oxygen donor concentration in the depletion layer of various types of red light-emitting diode by the previously described photo-capacitance method, discovering that a certain relationship existed between the maximum level of the oxygen donor concentration in the depletion layer and the light-emitting efficiency of a gallium phosphide device.

It is accordingly the object of this invention to provide a red light-emitting gallium phosphide device having a high electroluminescent efficiency, particularly, an external electroluminescent quantum efficiency higher than 3%.

According to an aspect of this invention, there is provided a red light-emitting gallium phosphide device wherein the maximum oxygen donor concentration in the depletion layer surrounding the p-n junction is chosen to range from $1 \times 10^{12} \text{cm}^{-3}$ to $5 \times 10^{14} \text{cm}^{-3}$.

Figure 4:
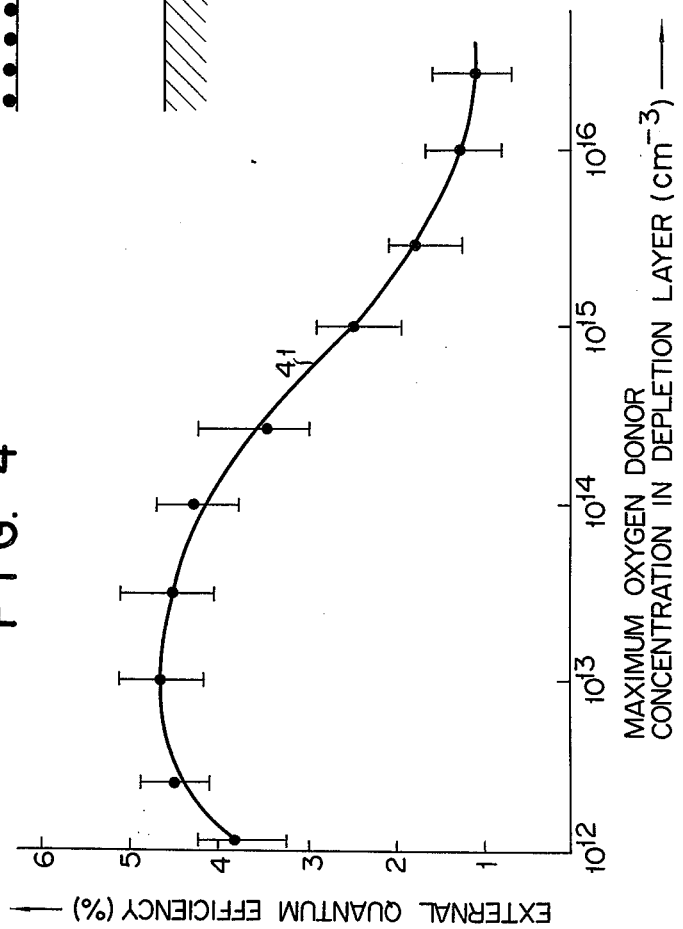
Figure 2:
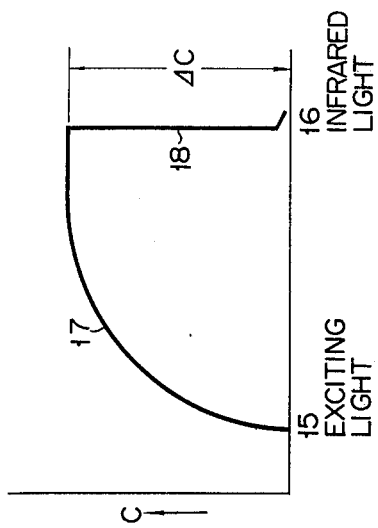
Figure 5:
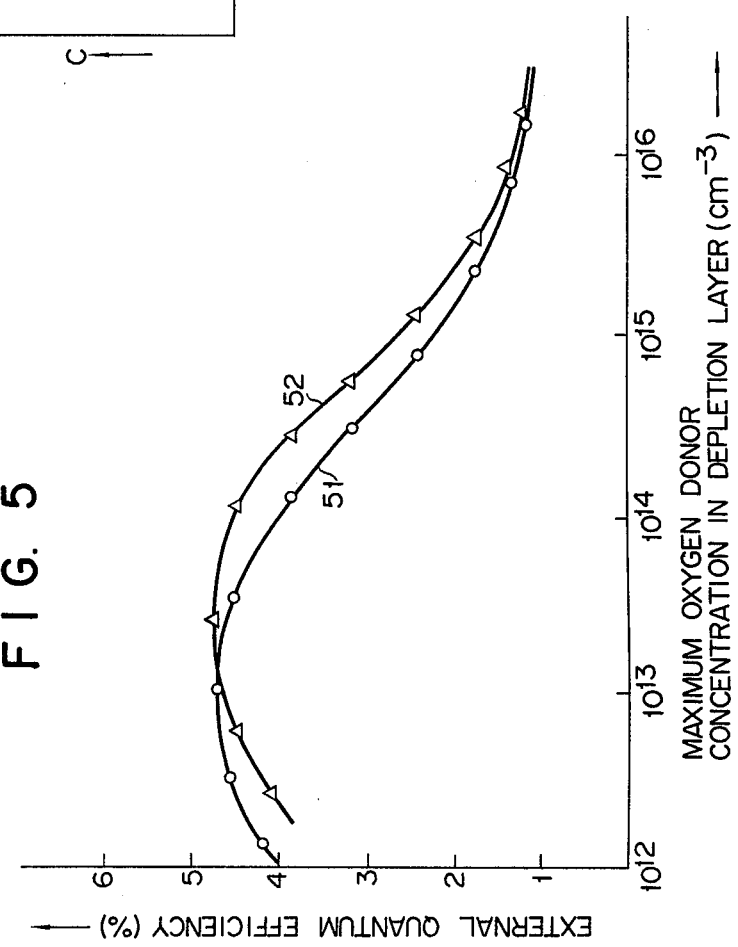
Figure 3:
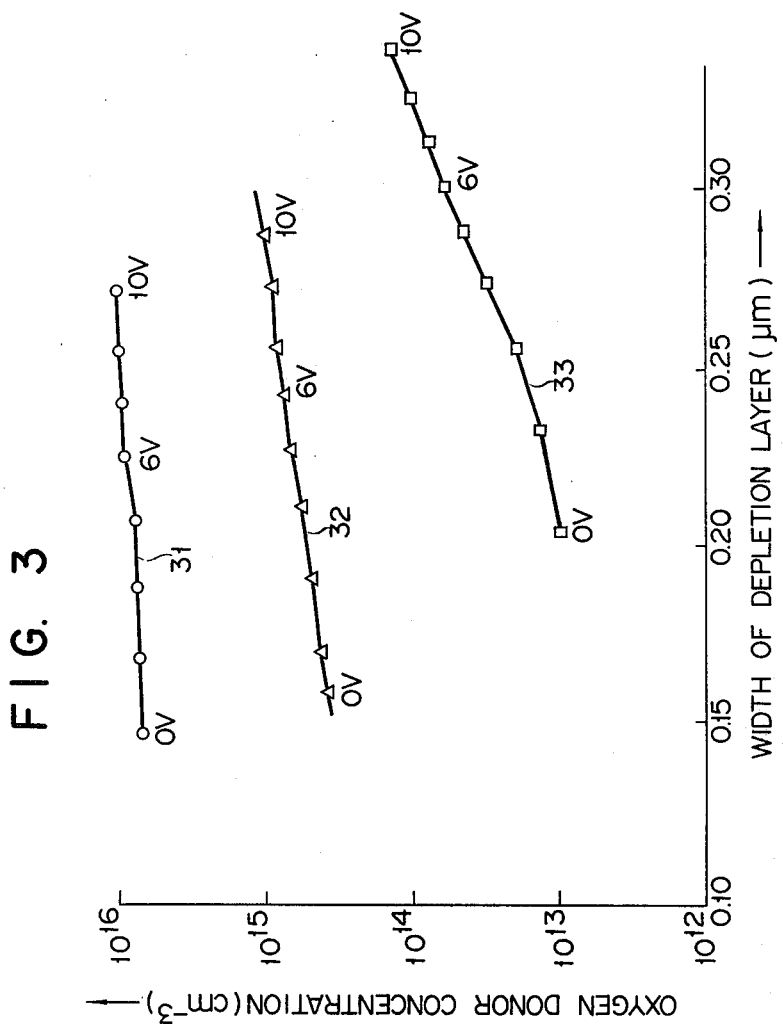

This invention can be more fully understood from the following detailed description when taken in conjunction with the accompanying drawings, in which:

FIGS. 1 and 2 are given by way of illustrating the photocapacitance method: FIG. 1 schematically shows the construction of an energy band near the p-n junction, and FIG. 2 is a curve diagram indicating changes in the capacitance;

FIG. 3 presents a relationship between the width of the depletion layer of the p-n junction and the oxygen donor concentration; and FIGS. 4 and 5 set forth a relationship between the maximum oxygen donor concentration in the depletion layer and the electroluminescent efficiency.

Various forms of red light-emitting gallium phosphide diode (hereinafter referred to as "GaP diodes") adopted as samples in this invention were each prepared by the following process. First, an n type GaP layer containing an impurity of tellurium was formed by the liquid phase epitaxial method on a substrate of an n type GaP crystal grown by the liquid encapsulated Czochralski method. A p type GaP layer containing zinc and oxygen was grown by the liquid phase epitaxial method on said n type GaP layer to provide a p-n junction. A wafer thus obtained was cut up into numerous rectangular parallelepiped pellets having a square cross section, each side of which measured 0.4 mm. The pellet was mounted on a header with an ohmic contact formed on both p and n sides, thus finally providing a red light-emitting GaP diode. Various forms of red light-emitting GaP diode were obtained by changing the tellurium donor concentration in the n type GaP substrate, as well as in the n type GaP layer superposed on the substrate from $1 \times 10^{17} cm^{-3}$ to $1 \times 10^{18} cm^{-3}$ and also varying the zinc acceptor concentration in the p type GaP layer similarly from $1 \times 10^{17} cm^{-3}$ to $1 \times 10^{18} cm^{-3}$ in providing the p-n junction on said substrate and further changing the rate at which an epitaxial solution was cooled for the liquid phase epitaxial growth of the p type GaP layer from 0.5°C/min to 10°C/min.

Measurement was made of the oxygen donor concentration in the depletion layer surrounding the p-n junction with respect to each of the various forms of red light-emitting GaP diode prepared in the above-mentioned manner, the results being set forth in FIG. 3. The width of the depletion layer surrounding the p-n junction is shown on the abscissa. Said width varies with the concentrations of the donor and acceptor, and indicates 0.1 to 0.2 μm at zero bias voltage and is enlarged to the neighborhood of a level ranging from 0.2 to 0.35 μm at backward voltage of 10 V. Shown on the ordinate is the measured oxygen donor concentration, which varies with the width of the depletion layer surrounding the p-n junction. The curve 31 of FIG. 3 indicates the distribution of the oxygen donor concentration in a GaP diode having a 1% external quantum efficiency; the curve 32 represents the distribution of said concentration in a GaP diode having a 2.5% external quantum efficiency; and the curve 33 illustrates the distribution of said concentration in a GaP diode having a 4.5% external quantum efficiency. All these efficiencies were obtained when the respective GaP devices were not coated with epoxy resin. Coating of said epoxy resin substantially doubled the above-mentioned external quantum efficiencies. FIG. 3 characteristically shows that with a GaP diode displaying a higher external quantum efficiency, the oxygen donor is distributed at a lower concentration through the depletion layer, for example, that in the case of the curve 33, the oxygen donor concentration stands at a lower level than $2 \times 10^{14} cm^{-3}$.

A red light-emitting GaP diode represented by the curve 33 is often obtained when said oxide is prepared by the steps of epitaxially growing an n type GaP layer containing a donor at concentrations from $2 \times 10^{17} cm^{-3}$ to $5 \times 10^{17} cm^{-3}$ on an n type GaP substrate containing a donor at concentrations from $1 \times 10^{17} cm^{-3}$ to $3 \times 10^{17} cm^{-3}$, and epitaxially forming a p type GaP layer containing an acceptor at concentrations from $1 \times 10^{17} cm^{-3}$ to $3 \times 10^{17} cm^{-3}$ on said n type GaP layer by cooling the required p-type epitaxial solution at a slower rate than 3°C/min.

As mentioned above, the width of the depletion layer surrounding the p-n junction noticeably varies with the concentrations of a donor and acceptor in the neightborhood of the p-n junction. Therefore, the properties of various GaP diodes can be compared more accurately on the basis of the oxygen donor concentration when the GaP diodes are impressed with the same level of voltage than on the basis of the oxygen donor concentration in the depletion layers having an equal width. The reason is that the level of voltage impressed on the GaP diodes is not affected by the concentrations of the donor and acceptor. The characters 0V, 6V and 10V attached to each of the curves 31, 32, 33 of FIG. 3 denote the magnitudes of backward voltage impressed on the p-n junction. As apparent from FIG. 3, the oxygen donor concentration in the depletion layer progressively increases toward the p region. Therefore, it will be seen that the oxygen donor concentration at the outer end of the p region of the depletion layer represents the maximum value of said concentration.

The curve 41 of FIG. 4 presents a relationship between the external quantum efficiency and the oxygen donor concentration No[6V] at the outer end of the p region of the depletion layer when the GaP diode is impressed with backward voltage of 6V. Ten dots in FIG. 4 denote the average value of each of the external quantum efficiencies corresponding to the oxygen donor concentrations in ten GaP diodes prepared from the rectangular parallelepiped pellets cut out of a wafer. The upper and lower ends of the upright lines parallel with the ordinate line respectively denote the maximum and minimum levels of the external quantum efficiencies associated with the oxygen donor concentrations in said ten GaP diodes. As apparent from FIG. 4, the external quantum efficiency is very high, namely, more than 3%, while the oxygen donor concentration remains within the range of from $1 \times 10^{12} cm^{-3}$ to $5 \times 10^{14} cm^{-3}$. Moreover, the maximum and minimum values of said external quantum efficiency bear a small ratio to each other. This small ratio means that the electroluminescent efficiencies of numerous GaP diodes prepared from pellets cut out of the same wafer or lot indicate prominently small variations.

The two curves of FIG. 5 show the plotted value of the external quantum efficiency corresponding to the oxygen donor concentration at the outer end of the p region of the depletion layer in each of a plurality of GaP diode samples when the p-n junction thereof is impressed with backward voltage. The curves 51 and 52 respectively represent the cases where the backward voltages applied were 3V and 10V. As seen from FIG. 5, higher external quantum efficiency than 3% is obtained when the oxygen donor concentration substantially falls within the range of from $1 \times 10^{12} cm^{-3}$ to $5 \times 10^{14} cm^{-3}$. Attainment of such high external quantum efficiency under the above-mentioned condition is supposed to be for the following reason. The value of from $1 \times 10^{12} cm^{-3}$ to $5 \times 10^{14} cm^{-3}$ means a low oxygen donor concentration in the depletion layer. This low oxygen donor concentration reduces the possibility of a recombination center being formed within the p-n junction and in consequence restricts the generation of recombination current in said junction, thereby supposedly enabling a larger amount of current to be injected p region. Another reason for the above-mentioned high external quantum efficiency is supposed to be that the decreased oxygen donor concentration conversely results in the extended lifetime of minority carriers present in the p-n junction and the adjacent luminescent region, thereby increasing the radiative recombination rate. Actual measurement of the lifetime of minority carriers in the luminescent region shows that said lifetime was 20 nanoseconds for the GaP diode represented by the curve 32, whereas said lifetime increased to 2.5 times, namely, 50 nanoseconds for the GaP diode denoted by the curve 33. Further, the reason why the external quantum efficiency decreases when the oxygen donor concentration No[6V] falls to below $1 \times 10^{12} cm^{-3}$ is assumed to originate with the fact that an excessive drop in the oxygen donor concentration leads to the prominently decreased concentration of Zn-O pairs forming a luminescent center.

For elevation of the external quantum efficiency, an attempt has hitherto been made to introduce as large an amount as possible of the oxygen donor into the p region of the p-n junction in order to increase the concentration of Zn-O pairs constituting a luminescent center. However, the present inventors have discovered that it is rather effective to reduce the oxygen donor concentration to a certain extent, increase the crystalline perfection of the p type GaP layer and extend the lifetime of minority carriers. Such form of red light-emitting Gap diode can be effectively realized, as previously described, by choosing the donor concentration in the n type GaP substrate to range from $1 \times 10^{17} cm^{-3}$ to $3 \times 10^{17} cm^{-3}$, the donor concentration in the n type epitaxial layer grown on said substrate to range from $2 \times 10^{17} cm^{-3}$ to $5 \times 10^{17} cm^{-3}$, and the acceptor concentration in the p type epitaxial layer to range from $1 \times 10^{17} cm^{-3}$ to $3 \times 10^{17} cm^{-3}$; and cooling the p type epitaxial solution at a slower rate than 3°C/min in the liquid phase epitaxial growth of the p type GaP layer bearing an oxygen donor.

The foregoing description referred to the case where an n type GaP layer and p type GaP layer were formed on an n type GaP substrate by liquid phase epitaxial growth to provide a red light-emitting GaP device. However, it is possible epitaxially to grow the p type GaP layer immediately on the n type GaP substrate. In this case said n type GaP substrate and p type GaP layer constitute a p-n junction contributing to the emission of red light.

What we claim is:

1. A red light-emitting gallium phosphide device wherein the maximum concentration of an oxygen donor in a depletion layer surrounding a p-n junction contributing to the emission of red light is chosen to range from $1 \times 10^{12} cm^{-3}$ to $5 \times 10^{14} cm^{-3}$.

2. A red light-emitting gallium phosphide device according to claim 1 wherein said p-n junction consists of the n type GaP substrate, n type GaP layer formed on said substrate by liquid phase epitaxial growth and p type GaP layer superposed on said n type GaP layer similarly by liquid phase epitaxial growth.

* * * * *